(12) United States Patent
Dupont et al.

(10) Patent No.: US 10,886,427 B2
(45) Date of Patent: Jan. 5, 2021

(54) OPTOELECTRONIC DEVICE COMPRISING THREE-DIMENSIONAL DIODES

(71) Applicants: ALEDIA, Grenoble (FR); COMMISSARIAT A L'ENERGIE ATOMIQUE ET AUX ENERGIES ALTERNATIVES, Paris (FR)

(72) Inventors: Florian Dupont, Grenoble (FR); Benoit Amstatt, Grenoble (FR); Vincent Beix, Fontaine (FR); Thomas Lacave, Grenoble (FR); Philippe Gilet, Teche (FR); Ewen Henaff, Fontaine (FR); Berangere Hyot, Eybens (FR); Hubert Bono, Grenoble (FR)

(73) Assignees: ALEDIA, Grenoble (FR); COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 17 days.

(21) Appl. No.: 16/313,749

(22) PCT Filed: Jun. 26, 2017

(86) PCT No.: PCT/FR2017/051693
§ 371 (c)(1),
(2) Date: Dec. 27, 2018

(87) PCT Pub. No.: WO2018/002498
PCT Pub. Date: Jan. 4, 2018

(65) Prior Publication Data
US 2019/0172970 A1 Jun. 6, 2019

(30) Foreign Application Priority Data

Jun. 30, 2016 (FR) .................... 16 56218

(51) Int. Cl.
*H01L 33/00* (2010.01)
*H01L 27/15* (2006.01)
(Continued)

(52) U.S. Cl.
CPC ........ *H01L 33/007* (2013.01); *H01L 27/1446* (2013.01); *H01L 27/156* (2013.01);
(Continued)

(58) Field of Classification Search
CPC . H01L 33/007; H01L 27/1446; H01L 27/156; H01L 31/02005; H01L 31/022408;
(Continued)

(56) References Cited

U.S. PATENT DOCUMENTS

2011/0254613 A1* 10/2011 Kim .................. H01L 49/003
327/513
2013/0099199 A1 4/2013 Cha et al.
(Continued)

FOREIGN PATENT DOCUMENTS

WO WO 2014/056762 A2 4/2014
WO WO 2014/064276 A1 5/2014

OTHER PUBLICATIONS

International Search Report dated Aug. 22, 2017 in PCT/FR2017/051693 filed on Jun. 26, 2017.

*Primary Examiner* — Shahed Ahmed
(74) *Attorney, Agent, or Firm* — Oblon, McClelland, Maier & Neustadt, L.L.P.

(57) ABSTRACT

An optoelectronic device including a support having a rear surface and a front surface opposite each other, a plurality of nucleation conductive strips forming first polarization electrodes, an intermediate insulating layer covering the nucleation conductive strips, a plurality of diodes, each of which having a first, three-dimensional doped region and a second doped region, and a plurality of top conductive strips form-
(Continued)

ing second polarization electrodes and resting on the intermediate insulating layer, each top conductive strip being disposed in such a way as to be in contact with the second doped regions of a set of diodes of which the first doped regions are in contact with different nucleation conductive strips.

15 Claims, 7 Drawing Sheets

(51) Int. Cl.
    *H01L 33/24*     (2010.01)
    *H01L 27/144*     (2006.01)
    *H01L 31/02*     (2006.01)
    *H01L 31/0224*     (2006.01)
    *H01L 31/0232*     (2014.01)
    *H01L 31/0304*     (2006.01)
    *H01L 31/0352*     (2006.01)
    *H01L 31/18*     (2006.01)
    *H01L 33/32*     (2010.01)
    *H01L 33/42*     (2010.01)
    *H01L 33/46*     (2010.01)
    *H01L 33/62*     (2010.01)
    *H01L 33/38*     (2010.01)
    *H01L 33/18*     (2010.01)
    *H01L 33/06*     (2010.01)

(52) U.S. Cl.
    CPC .. *H01L 31/02005* (2013.01); *H01L 31/02327* (2013.01); *H01L 31/022408* (2013.01); *H01L 31/03044* (2013.01); *H01L 31/035281* (2013.01); *H01L 31/1852* (2013.01); *H01L 31/1856* (2013.01); *H01L 33/24* (2013.01); *H01L 33/32* (2013.01); *H01L 33/42* (2013.01); *H01L 33/46* (2013.01); *H01L 33/62* (2013.01); H01L 31/035227 (2013.01); H01L 33/06 (2013.01); H01L 33/18 (2013.01); *H01L 33/385* (2013.01)

(58) Field of Classification Search
    CPC ......... H01L 31/02327; H01L 31/03044; H01L 31/035281; H01L 31/1852; H01L 31/1856; H01L 33/24; H01L 33/42; H01L 33/46; H01L 33/62; H01L 31/035227; H01L 33/06; H01L 33/18; H01L 33/385; H01L 33/00–648
    See application file for complete search history.

(56) References Cited

U.S. PATENT DOCUMENTS

| | | |
|---|---|---|
| 2013/0112944 A1 | 5/2013 | Cha et al. |
| 2015/0118777 A1 | 4/2015 | Seo et al. |
| 2015/0187991 A1* | 7/2015 | McGroddy ............. H01L 33/14 257/13 |
| 2015/0279903 A1* | 10/2015 | Mandl ................. H01L 33/0062 257/88 |
| 2015/0280053 A1* | 10/2015 | Gilet ................... H01L 31/1804 438/46 |
| 2015/0303350 A1 | 10/2015 | Seo et al. |
| 2017/0207365 A1* | 7/2017 | Grundmann ............ H01L 33/06 |
| 2018/0248144 A1* | 8/2018 | Carroll ................. H01L 51/504 |

* cited by examiner

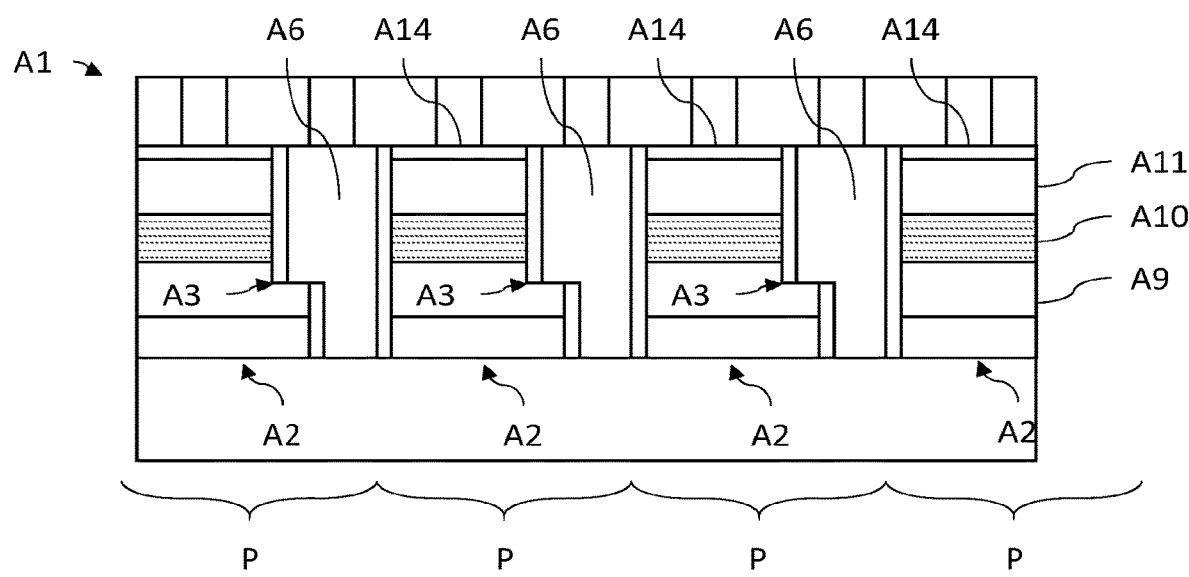
Fig.1
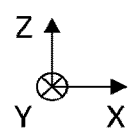

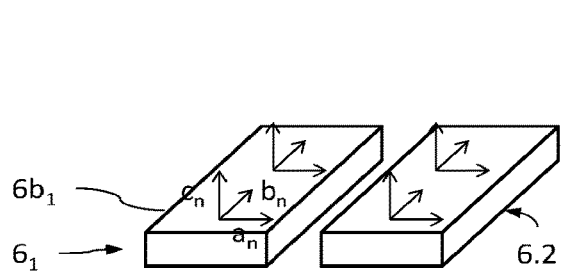
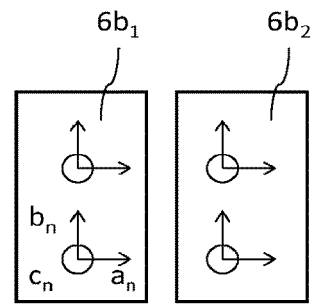
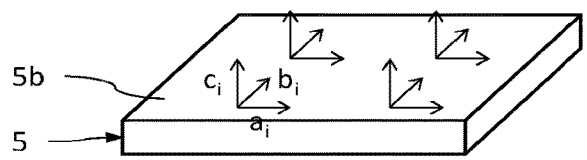
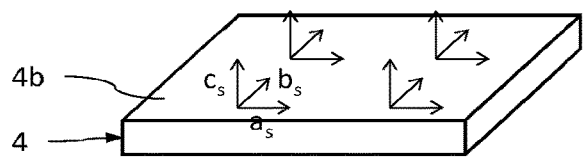
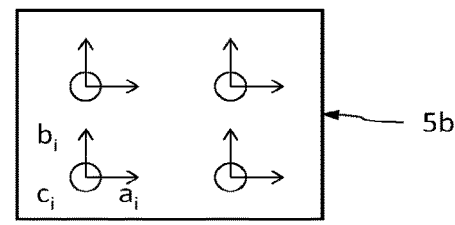
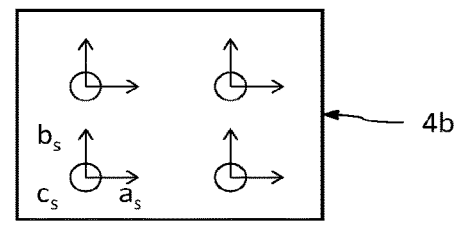
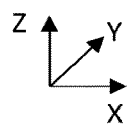
Fig.3A
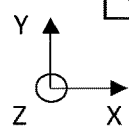
Fig.3B
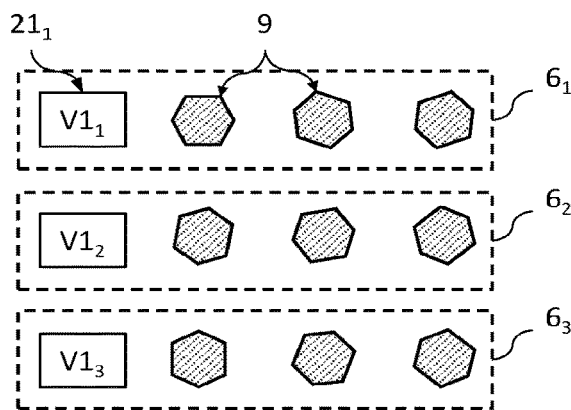
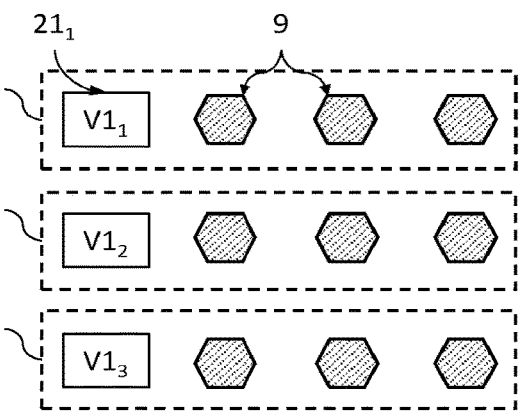
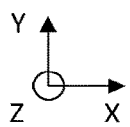
Fig.3C            Fig.3D

OPTOELECTRONIC DEVICE COMPRISING THREE-DIMENSIONAL DIODES

TECHNICAL FIELD

The field of the invention is that of optoelectronic devices comprising electroluminescent diodes or photodiodes. The invention is applied in the field of devices comprising a matrix of electroluminescent diodes such as lighting devices, display screens, and image projectors, as well as in the field of devices comprising a matrix of photodiodes such as photodetectors and sensors.

PRIOR ART

There are optoelectronic devices having a matrix of electroluminescent diodes suitable for producing lighting devices, display screens, and image projectors. The document EP2960950 illustrates an example of an optoelectronic device comprising a matrix of electroluminescent diodes. As shown schematically in FIG. 1, this optoelectronic device A1 comprises a plurality of electroluminescent diodes A2, each comprising a stack of a p-doped region A11 and an n-doped region A9 separated from each other by an active zone A10 from which the majority of the luminous radiation of the diode A2 is generated.

The electroluminescent diodes A2 have a so-called mesa structure, i.e. they are obtained from a stack of semiconductor layers configured to form the n- and p-doped regions A9, A11 and the active zone A10, localized etching being carried out in such a way as to individually separate the electroluminescent diodes A2 from one another. Each diode A2 comprises an L-shape the sides of which are coated with an insulating layer, except in a recess A3 that forms the n-doped region A9. First electrodes A14 rest on the top surface of the p-doped regions A11, and second electrodes A6 extend between the diodes A2 and come into contact with recesses A3 formed by the n-doped regions A9. A display pixel then comprises the stack of the doped regions A9, A11, the active zone A10, and the first electrode A14, as well as the second electrode A6 adjacent to the stack. A connection structure is assembled to the top surface of the matrix of electroluminescent diodes and is designed to be hybridized to a control integrated circuit.

However, this optoelectronic device has the drawback of requiring a step of etching the doped semiconductor layers and the active layer in order to individually separate the diodes. This etching step can cause the formation of structural defects that may degrade the optical and/or electronic properties of the diodes. Moreover, the ratio of the emitting surface of each diode to the surface of each pixel is reduced by the need to form a recess in the n-doped region and by the presence of the second electrode that extends between the diodes in such a way as to come into contact with this recess. This thus reduces the maximum luminous intensity relative to each pixel.

DESCRIPTION OF THE INVENTION

The object of the invention is to at least partially overcome the drawbacks of the prior art, and more particularly to propose an optoelectronic device comprising:
a support that has a rear surface and a front surface opposite each other;
a plurality of nucleation conductive strips that form first polarization electrodes, distinct from each other and resting on said front surface, made of an electrically conductive material suitable for the growth of first doped regions of diodes;
an intermediate insulating layer that covers the nucleation conductive strips and comprises through-openings opening onto the nucleation conductive strips;
a plurality of diodes, each of which has a first three-dimensional doped region and a second doped region disposed in such a way as to form a p-n junction, the first doped regions being in contact with the nucleation conductive strips through said through-openings and extending along a longitudinal axis substantially orthogonal to the front surface;
a plurality of top conductive strips that form second polarization electrodes, distinct from each other and resting on the intermediate insulating layer, each top conductive strip being disposed in such a way as to be in contact with second doped regions of a set of diodes of which the first doped regions are in contact with different nucleation conductive strips.

Some preferred but not limiting aspects of this optoelectronic device are as follows.

The support can comprise an electrically insulating substrate of which a top surface forms said front surface, or can comprise a semiconductor or electrically conductive layer or substrate, coated with a so-called bottom insulating layer, one surface of which forms said front surface.

Each nucleation conductive strip can extend longitudinally on the front surface, being electrically separated from its neighbors, transversely, by said intermediate insulating layer.

Each top conductive strip can extend longitudinally on the intermediate insulating layer, being electrically separated from its neighbors, transversely, by a so-called top insulating layer.

The top conductive strips can be made of an at least partially transparent conductive material, and can at least partially cover the second doped regions.

Each top conductive strip can comprise portions that cover the second doped regions of a set of diodes, said so-called covering portions being connected to each other by so-called connecting parts resting on the intermediate insulating layer.

The connecting parts of the top conductive strips can be at least partially coated with a metal layer.

The optoelectronic device can comprise first connection pads resting on said rear surface and electrically connected to the nucleation conductive strips by first openings passing through the support and filled with a conductive material, and/or can comprise second connection pads resting on said rear surface and electrically connected to the top conductive strips by second openings passing through the support and the intermediate insulating layer and filled with a conductive material.

The optoelectronic device can comprise a control integrated circuit assembled to the support and electrically connected to the nucleation conductive strips and the top conductive strips, suitable for applying a potential difference, sequentially, to different subsets of diodes, the one or more diodes of a same subset being in contact with a same nucleation conductive strip and a same top conductive strip, the one or more diodes of different subsets of diodes being in contact with different nucleation conductive strips and/or different top conductive strips.

At least one diode in contact with a first nucleation conductive strip and a first top conductive strip can be connected in series with at least one other diode, the latter being in contact with a second nucleation conductive strip distinct from the first nucleation strip and a second top conductive strip distinct from the first top strip.

The support can be composed of a substrate made of a monocrystalline material that forms a top surface, on which rests a so-called bottom insulating layer made of a dielectric material, epitaxially grown from the top surface of the substrate and forming an opposing top surface, the nucleation conductive strips being made of a material comprising a transition metal forming a crystalline nucleation material, epitaxially grown from the top surface of the bottom insulating layer and forming a nucleation surface on which the first doped regions of said diodes are in contact.

The material of the bottom insulating layer can be selected from aluminum nitride and oxides of aluminum, titanium, hafnium, magnesium and zirconium, and has a hexagonal, face-centered cubic, or orthorhombic crystalline structure.

The material of the nucleation conductive strips can be selected from titanium, vanadium, chromium, zirconium, niobium, molybdenum, hafnium, tantalum and tungsten, or from a nitride or a carbide of titanium, vanadium, chromium, zirconium, niobium, molybdenum, hafnium, tantalum and tungsten, and has a hexagonal or face-centered cubic crystalline structure. In a variant, it can be a gallium-nitride-based material, for example GaN, AlGaN, InGaN, or AlInGaN.

The monocrystalline material of the substrate can be selected from a group III-V compound, a group II-VI compound, or a group IV element or compound, and has a hexagonal or face-centered cubic crystalline structure.

The invention also relates to a method for producing the optoelectronic device according to any of the preceding characteristics, comprising a step of epitaxial growth of the nucleation conductive strips by sputtering at a growth temperature between room temperature and 500° C.

BRIEF DESCRIPTION OF THE DRAWINGS

Other aspects, objects, advantages and characteristics of the invention will be better understood after reading the following detailed description of preferred embodiments thereof, given by way of non-limiting example and with reference to the attached drawings, which are as follows:

FIG. 1, already described, is a schematic and partial view of an example of an optoelectronic device comprising a matrix of electroluminescent diodes, as described in the document EP2960950;

FIGS. 3A and 3B are, respectively exploded and perspective, schematic and partial views of the substrate, the bottom insulating layer, and the nucleation conductive strips (arranged from bottom to top) of an optoelectronic device according to a preferred embodiment; and FIGS. 3C and 3D are top views of epitaxial wires on textured nucleation surfaces (FIG. 3C) and on epitaxial nucleation surfaces (FIG. 3D);

DETAILED DESCRIPTION OF SPECIFIC EMBODIMENTS

Figure 2A:
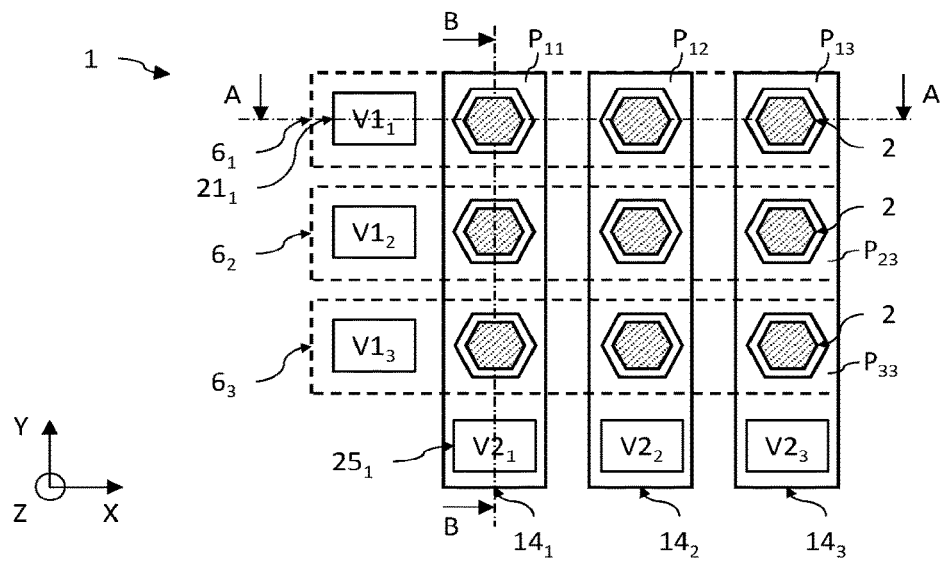
FIG. 2A is a schematic and partial top view of an optoelectronic device according to an embodiment wherein a plurality of diodes is in contact with the nucleation conductive strips and the top conductive strips.

In the figures and in the remainder of the description, the same reference numbers represent identical or similar elements. Moreover, the different elements are not shown to scale in order to make the figures clearer. In addition, the different embodiments and variants are not exclusive of one another and can be mutually combined. Unless otherwise indicated, the terms "substantially", "approximately", and "of the order of" mean "within 10%" or, in the case of angular orientation, "within 10°".

The invention relates to an optoelectronic device comprising diodes, for example electroluminescent diodes having a three-dimensional shape, each of which comprises a first doped region and a second doped region disposed in such a way as to form a p-n junction. The diodes can be electroluminescent diodes suitable for emitting luminous radiation or photodiodes suitable for receiving luminous radiation. The three-dimensional shape of the diodes can be such that the diodes have a wire, pad, pyramidal, or other shape. The first doped regions of the diodes extend along a longitudinal axis substantially orthogonal to the main plane of the support.

The optoelectronic device comprises first electrodes suitable for bringing the first doped regions of the diodes to a first electrical potential V1 and second electrodes suitable for bringing the second doped regions to a second electrical potential V2. The first electrodes are in the form of nucleation conductive strips, distinct from each other, on which rest and are in contact the first doped regions. The second electrodes are in the form of so-called top conductive strips, distinct from each other, in contact with the second doped regions.

Here, and for the remainder of the description, a direct three-dimensional reference (X, Y, Z) is defined, wherein the X and Y axes form a plane parallel to the main plain of the substrate, and wherein the Z axis is oriented substantially orthogonal to the growth surface of the substrate. In the remainder of the description, the terms "vertical" and "vertically" are understood to be relative to an orientation substantially parallel to the Z axis, and the terms "horizontal" and "horizontally" are understood to be relative to an orientation substantially parallel to the plane (X, Y). In addition, the terms "less" and "greater" are understood to be relative to an increasing positioning when one moves away from the growth surface of the substrate in the direction +Z.

The term conductive strip is understood to refer to a section of a semiconductor or conductive material, deposited in a thin layer, that has a longitudinal dimension in the plane (X, Y), or a length, greater than the transverse dimension in the plane (X, Y), or its width, and than the dimension of thickness along the Z axis.

Each nucleation conductive strip of index i is in contact with a set $D_i$ of several diodes that are in contact with different top conductive strips. Similarly, each top conductive strip of index j is in contact with a set $D_j$ of several diodes that are in contact with different nucleation conductive strips. Thus, the one or more diodes that are in contact with a same nucleation conductive strip of index i and a same top conductive strip of index j form a pixel P of indices i, j.

Figure 2B:
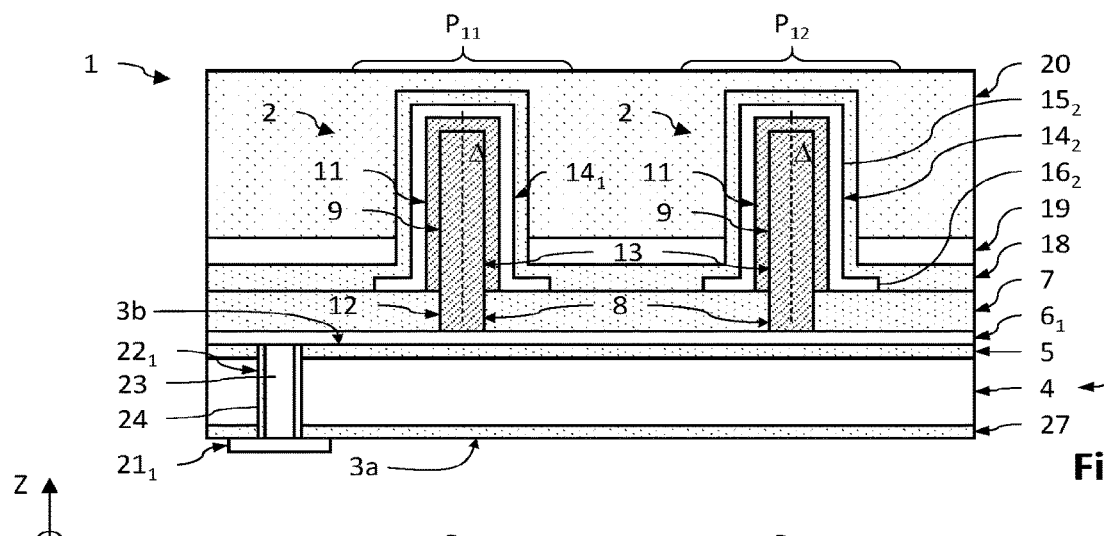
FIGS. 2B and 2C are sectional views, respectively along planes AA and BB, of the optoelectronic device shown in FIG. 2A.
Figure 2C:
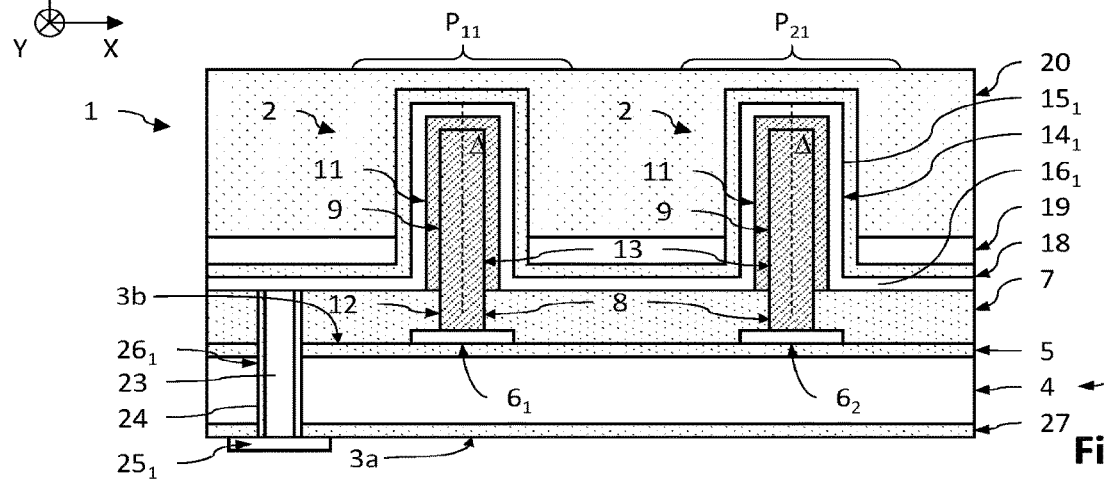

FIGS. 2A, 2B and 2C are schematic and partial views, from the top respectively, in cross-section along plane AA and plane BB, of an optoelectronic device 1 comprising electroluminescent diodes 2 according to a first embodiment.

The optoelectronic device 1 comprises:
a support 3, comprising so-called back 3a and front 3b surfaces opposite each other;
a plurality of first electrodes in the form of so-called nucleation conductive strips $6_i$, distinct from each other and resting on said front surface 3b, made of an electrically conductive material suitable for the growth of the first doped regions 9 of diodes 2;
an intermediate insulating layer 7 that covers the nucleation conductive strips $6_i$ and comprises through-openings 8 opening onto the nucleation conductive strips $6_i$;
a plurality of diodes 2, each of which has a first three-dimensional doped region 9 and a second doped region 11 disposed in such a way as to form a p-n junction, the first doped regions 9 being in contact with the nucleation conductive strips $6_i$ through said through-openings 8 and extending along a longitudinal axis Δ substantially orthogonal to the front surface 3b;
a plurality of second electrodes in the form of so-called top conductive strips $14_j$, distinct from each other and resting on the intermediate insulating layer 7, each top conductive strip $14_j$ being disposed in such a way as to be in contact with second doped regions 11 of a set $D_j$ of diodes 2 of which the first doped regions 9 are in contact with different nucleation conductive strips $6_i$.

As discussed in detail below, the one or more diodes 2 in contact with a nucleation conductive strip 6 of index i and in contact with a top conductive strip 14 of index j form an emissive pixel $P_{ij}$. Thus, a plurality of emissive pixels $P_{ij}$ is formed by the arrangement of the first and second electrodes in several conductive strips distinct from each other. In this example, each pixel $P_{ij}$ comprises a single diode, but in a variant can comprise a plurality of diodes. In other words, each nucleation conductive strip $6_i$ is in contact with a set $D_i$ of diodes, distributed in subsets $P_{ij}$ distinct from one another. Each subset $P_{ij}$ of diodes of a same nucleation conductive strip $6_i$ is in contact with a same top conductive strip 14 of index j and forms a pixel $P_{ij}$.

The support 3 comprises two surfaces, the so-called front 3b and rear 3a surfaces, which are opposite each other. It can be a monobloc structure or be composed of a stack of layers such as a substrate 4 of the SOI (silicon on insulator) type. It comprises an electrically insulating material at the level of the front surface 3b. It can thus be composed, for example, of an insulating monobloc substrate 4 or be composed of a semiconductor or conductive substrate 4 of which the top surface is coated with an insulating layer 5.

The material of the substrate 4 can be electrically insulating, such as e.g. an oxide of silicon (such as $SiO_2$) or of sapphire, or be a semiconductor material selected for example from the group III-V compounds comprising at least one element of group III and at least one element of group V of the periodic table, the group II-VI compounds, or the group IV elements or compounds. By way of example, it can be silicon, germanium, or silicon carbide. Preferably, the semiconductor material of the substrate 4 is monocrystalline silicon.

The substrate 4 can have a thickness between 50 nm and 1500 μm, depending on whether or not it has been thinned. In this example, wherein the support has been thinned in order to allow resumption of electrical contact on the rear surface 3a, it has a thickness for example of between 10 μm and 300 μm, preferably between 10 μm and 100 μm. In cases where it has not been thinned, particularly when the resumption of contact is carried out on the front surface 3b, it has a thickness between 300 μm and 1500 μm, for example equal to approximately 725 μm.

In this example, the support is composed of a semiconductor substrate 4 of which the top surface is coated with a so-called bottom insulating layer 5 made of a dielectric material. The bottom insulating layer 5 provides electrical insulation between the nucleation conductive strips $6_i$ and the substrate 4 when the latter is electrically conductive. The material of the bottom insulating layer 5 can be an oxide of silicon (such as $SiO_2$) or of aluminum (such as $Al_2O_3$), a nitride of silicon SiNx or of aluminum AlN, an oxynitride of silicon SiOxNy, or any other suitable material. The thickness of the bottom insulating layer 5 can be between 5 nm and 500 nm, preferably between 10 nm and 100 nm, for example equal to approximately 30 nm.

In a variant (not shown), the substrate can be omitted and the support can then be composed of a deposited layer, for example a reflecting layer, optionally metallic, allowing the reflection of the incident luminous radiation emitted by the diodes 2. The steps of omission of the substrate and depositing the layer of the support can be carried out after production of the diodes.

The first polarization electrodes are disposed in such a way as to allow the application of a first electrical potential $V1_i$ to different sets of diodes. They take the form of a plurality of nucleation conductive strips $6_i$ that rest on the front surface 3b of the support, here the top surface of the bottom insulating layer 5. Each nucleation conductive strip $6_i$ has a top surface, opposite the front surface 3b of the support, that forms a nucleation surface with which each first doped region 9 of the diode 2 is in contact. The nucleation conductive strips $6_i$ are distinct from each other and can have an electrical potential $V1_i$, which varies over time, the value of which can differ from one strip to the other. They can extend longitudinally in the plane (X, Y) in a rectilinear or curved manner parallel to one another. Each nucleation conductive strip 6 of index i is in contact with a set $D_i$ of diodes at the level of the first doped regions 9 thereof, the sets of diodes differing from one nucleation conductive strip $6_i$ to the other.

The nucleation conductive strips $6_i$ are made of an electrically conductive material suitable for the nucleation and growth of the first doped regions 9. This material can be made of gallium nitride GaN or an alloy based on gallium nitride, for example an alloy of gallium nitride and aluminum AlGaN, gallium nitride and indium InGaN, or even gallium nitride, aluminum, and indium AlInGaN. In a variant, the nucleation conductive strips $6_i$ can be made of a material comprising a transition metal. It can be selected from titanium, vanadium, chromium, zirconium, niobium, molybdenum, hafnium, tantalum and tungsten, or made of a nitride or a carbide of a transition metal, for example titanium, zirconium, hafnium, vanadium, niobium, tantalum, chromium, molybdenum, tantalum, or made of a combination of these compounds. The transition metals, as well as their nitrides and carbides, have the advantages of allowing nucleation of the first doped regions 9 and having an electrical conductivity close to that of the metals. The nucleation conductive strips $6_i$ have a width for example of between 5 nm and 500 nm, preferably between 10 nm and 100 nm, for example equal to approximately 30 nm. They have a transverse dimension in the plane (X, Y), or a width, for example, of between 20 nm and 50 µm, preferably between 200 nm and 10 µm, and preferably between 800 nm and 5 µm, for example equal to approximately 1 µm. The nucleation conductive strips $6_i$ are transversely spaced with respect to one another at a distance for example of between 500 nm and 20 µm, and preferably between 1000 nm and 2000 nm, for example equal to 1500 nm.

The optoelectronic device 1 also comprises a so-called intermediate insulating layer 7 that covers the front surface 3b of the support, and covers in particular the nucleation conductive strips $6_i$. It forms a growth mask allowing epitaxial growth of the first doped regions 9 of the diodes from through-openings 8 opening locally onto the nucleation surfaces. Moreover, it extends in such a way as to separate each nucleation conductive strip $6_i$, transversely, from its neighbors. It also plays a role in providing the electrical insulation between the nucleation conductive strips $6_i$ and the top conductive strips $14_j$. The intermediate insulating layer 7 is made of one or more dielectric materials such as, for example, an oxide of silicon (such as $SiO_2$) or a nitride of silicon (such as $Si_3N_4$ or SiN), or even an oxynitride of silicon, an oxide of aluminum (such as $Al_2O_3$) or an oxide of hafnium (such as $HfO_2$). The thickness of the intermediate insulating layer 7 can be between 5 nm and 500 nm, and preferably between 30 nm and 300 nm, for example equal to approximately 100 nm.

Each electroluminescent diode 2 comprises a first doped region 9 of three-dimensional shape. In this embodiment, the first doped regions 9 have an elongated shape along a longitudinal axis Δ, i.e. in which the longitudinal dimension along the longitudinal axis Δ is greater than the transverse dimensions. The first doped regions 9 are then referred to as "wires", "nanowires", or "microwires". The transverse dimensions of the wires 9, i.e. their dimensions in a plane orthogonal to the longitudinal axis Δ, can be between 10 nm and 10 µm, for example between 100 nm and 10 µm, and preferably between 100 nm and 5 µm. The height of the wires 9, i.e. their longitudinal dimension along the longitudinal axis Δ, is greater than the transverse dimensions, for example 2 times, 5 times, and preferably at least 10 times greater. The cross-section of the wires 9, in a plane orthogonal to the longitudinal axis Δ, can have different shapes, for example a circular, oval, polygonal, e.g. triangular, square, rectangular or even hexagonal shape. Here, the diameter is defined as being a parameter associated with the perimeter of the wire at the level of a cross-section. It can be the diameter of a disk having the same surface as the cross-section of the wire. The local diameter is the diameter of the wire at a given height thereof along the longitudinal axis Δ. The mean diameter is the mean, for example the arithmetic mean, of the local diameters along the wire or a portion thereof.

Each first doped region 9 extends from the nucleation surface of a nucleation conductive strip $6_i$, along a longitudinal axis Δ oriented substantially orthogonal to the plane (X, Y). Each diode 2 also comprises an active zone and a second doped region 11. Here, the wire 9 forms the core of an electroluminescent diode 2 in a core/shell configuration, with the active zone and the second doped region 11 covering the lateral edge of a so-called upper portion 13 of the wire 9. The wires 9 comprise a bottom portion 12 that is in contact with the nucleation surfaces and is surrounded by the intermediate insulating layer 7. This bottom portion 12 is extended by the top portion 13 that is located outside the through growth openings 8 and is covered by the active zone and the second doped region 11.

The wires 9 can be made from a crystalline material epitaxially grown from the nucleation surface. The material of the wires 9 predominantly comprises a first semiconductor compound that can be selected from group III-V compounds and in particular from group III-N compounds, group II-VI compounds, or group IV compounds or elements. By way of example, group III-V compounds can be compounds such as GaN, InGaN, AlGaN, AlN, InN or AlInGaN, or even compounds such as AsGa or InP. Group II-VI compounds can be CdTe, HgTe, CdHgTe, ZnO, ZnMgO, CdZnO, or CdZnMgO. Group IV elements or compounds can be Si, C, Ge, SiC, SiGe, or GeC. The wires 9 thus form the first regions of the diodes, and are doped according to a first type of conductivity, here type n. In this example, the wires 9 are made of n-doped GaN, particularly with silicon. Here, they have an average diameter of between 10 nm and 10 µm, for example between 500 nm and 5 µm, and is here substantially equal to 500 nm. The height of the wires 9 can be between 100 nm and 100 µm, for example between 500 nm and 50 µm, and is here substantially equal to 5 µm.

The active zone is the region of the diode 2 at the level of which most of the luminous radiation of the diode is emitted. It can comprise at least one quantum well made of a semiconductor compound having a band gap energy less than those of the wire 9 and the second doped region 11. Here, it covers the upper edge and the lateral edge of the wire 9. It can comprise a single quantum well or a plurality of quantum wells in the form of layers or boxes intercalated between barrier layers. Alternatively, the active zone may not comprise a quantum well. It can have a band gap energy substantially equal to that of the wire 9 and the second doped region 11. It can be made of a semiconductor compound that is not intentionally doped.

The second doped region 11 forms a layer that covers and at least partially surrounds the active zone. It is made of a second semiconductor compound doped according to a second type of conductivity opposite to the first type, i.e. here of type p. The second semiconductor compound can be identical to the first semiconductor compound of the wire or can comprise the first semiconductor compound and also one or more additional elements. In this example, the second doped region 11 can be p-doped GaN or InGaN, particularly with magnesium. The thickness of the second doped region 11 can be between 20 nm and 500 nm, and can be equal to approximately 150 nm. Of course, the types of conductivity of the first and second regions 9, 11 can be reversed.

The second doped region 11 can also comprise an electron blocking interlayer (not shown) located at the interface with the active zone. Here, the electron blocking layer can be composed of a ternary III-N compound, such as AlGaN or AlInN, advantageously p-doped. This makes it possible to increase the rate of radiative recombinations in the active zone.

The second polarization electrodes $14_j$ are disposed in such a way as to allow the application of a second electrical potential $V2_j$ to different sets of diodes. They take the form of a plurality of so-called top conductive strips $14_j$ that rest on the top surface of the intermediate insulating layer 7. They are distinct from each other and can have an electrical potential $V2_j$ that varies with time, the value of which can differ from one strip to the other. They are also electrically separated from the nucleation conductive strips $6_i$ by the intermediate insulating layer 7. They can extend longitudinally in the plane (X, Y) in a rectilinear or curved manner parallel to one another. In this embodiment, each top conductive strip $14_j$ extends longitudinally and comprises portions $15_j$ that cover the second doped regions 11 of said diodes 2 that are interconnected by so-called connecting parts $16_j$ extending in a substantially planar manner on the top surface of the intermediate insulating layer 7.

Each top conductive strip 14 of index j is in contact with a set $D_j$ of diodes 2 at the level of the second doped regions 11 thereof, the sets $D_j$ of diodes 2 being different from one top conductive strip $14_j$ to the other. The top conductive strips $14_j$ extend transversely to the nucleation conductive strips $6_i$, such that a set $D_i$ of diodes 2 in contact with a nucleation conductive strip 6 of index i is not identical to a set $D_j$ of diodes 2 in contact with a top conductive strip $14_j$. The intersection between a set $D_i$ of diodes 2 of a nucleation conductive strip 6 of index i and a set $D_j$ of diodes 2 of a top conductive strip 14 of index j forms a pixel $P_{ij}$.

The top conductive strips $14_j$ are made of an electrically conductive material, and when they cover the second doped regions 11, this material is advantageously transparent to the luminous radiation emitted by the diodes. For example, it can be an indium tin oxide (ITO), or a gallium-doped zinc oxide (GZO), or even a material doped with aluminum or indium. The term transparent, or at least partially transparent, is understood to refer to a material that transmits at least 50% of incident light, and preferably at least 80% or even more.

The top conductive strips $14_j$ have a thickness for example of between 5 nm and 500 nm, preferably between 10 nm and 100 nm, for example equal to approximately 50 nm. They have a transverse dimension in the plane (X, Y), or a width, for example, of between 20 nm and 50 µm, preferably between 200 nm and 10 µm, preferably between 800 nm and 5 µm, for example equal to approximately 1.5 µm. The width is such that each top conductive strip $14_j$ is electrically separated from its neighbors. The length of the top conductive strips $14_j$ is such that each top conductive strip $14_j$ is in contact with the second doped regions 11 of a set of diodes 2 that are in contact with different nucleation conductive strips $6_i$. The top conductive strips $14_j$ are transversely spaced with respect to one another at a distance for example of between 1000 nm and 10 µm, preferably between 1000 nm and 3000 nm, for example equal to 2500 nm.

In this embodiment, a so-called top insulating layer 18 that is at least partially transparent conformally covers the top conductive strips $14_j$ and the top surface of the intermediate insulating layer 7. It can be made of a dielectric material transparent to the luminous radiation emitted by the diodes, for example, an oxide of silicon (such as $SO_2$) or of aluminum (such as $Al_2O_3$), a nitride of silicon SiNx or of aluminum AlN, an oxynitride of silicon SiOxNy, or any other suitable material. It has a thickness for example of between 5 nm and 500 nm, preferably between 50 nm and 300 nm, for example equal to approximately 100 nm.

In this example, a reflecting layer 19 is present between the diodes 2 and rests on the top insulating layer 18, but without covering the wires 9. It is made of a material suitable for reflecting the incident luminous radiation emitted by the diodes 2 toward the exterior of the optoelectronic device 1 in the direction +Z. The material can be a metal, for example aluminum, silver, gold, copper, or a combination thereof, or any other suitable material. The reflecting layer 19 has a thickness for example of between 10 nm and 2 µm, and preferably between 100 nm and 500 nm, for example equal to approximately 200 nm.

In this example, an encapsulation layer 20 covers the diodes. It is made of a dielectric material at least partially transparent to the luminous radiation emitted by the diodes and can for example be an oxide of silicon (such as $SiO_2$) or of aluminum (such as $Al_2O_3$), a nitride of silicon SiNx or of aluminum AlN, an oxynitride of silicon SiOxNy, or any other suitable material. The thickness of the encapsulation layer 20 is such that it covers the diodes, particularly at their peak. It is for example between 500 nm and 50 µm.

As shown in FIG. 2B, the optoelectronic device 1 also comprises a plurality of first connection pads $21_i$ each being electrically connected to a nucleation conductive strip $6_i$. The first connection pads $21_i$ can be located on the front surface 3b or on the rear surface 3a of the support. In this example, the electrical connection is carried out on the rear surface 3a of the support. For this purpose, first through openings $22_i$ extend between the front 3b and rear 3a surfaces of the support, each opening onto a nucleation conductive strip $6_i$. The through openings $22_i$ are filled with a conductive material 23 and are in contact on the one hand with the material of the nucleation conductive strip $6_i$ and on the other with a first connection pad $21_i$. In order to insulate, if necessary, the material of the semiconductor or conductive substrate 4, the sides of the through openings $22_i$ are coated with an insulating layer 24. The filling material 23 and that of the first connection pads $21_i$ can be copper, gold, aluminum, or any other suitable conductive material.

As shown in FIG. 2C, the optoelectronic device 1 also comprises a plurality of second connection pads $25_j$, each being electrically connected to a top conductive strip $14_j$. The second connection pads $25_j$ can be located on the front surface 3b or the rear surface 3a of the support. In this example, the electrical connection is carried out on the rear surface 3a of the support. For this purpose, second through openings $26_j$ extend between the front 3b and rear 3a surfaces of the support, each opening onto a top conductive strip $14_j$. The through openings $26_j$ are filled with a conductive material 23 and are in contact on the one hand with the material of the top conductive strip $14_j$ and on the other with a second connection pad $25_j$. In order to insulate, if necessary, the conductive material of the semiconductor substrate 4, the sides of the through openings $26_j$ are coated with an insulating layer 24. The filling material 23 and that of the second connection pads $25_j$ can be copper, gold, aluminum, or any other suitable conductive material.

An insulating layer 27 can cover the rear surface 3a of the support in such a way as to electrically insulate the first and second connection pads $21_i$ and $25_j$ with respect to the material of the substrate 4.

The optoelectronic device 1 comprises a control integrated circuit (not shown) assembled to the support and electrically connected to the nucleation conductive strips $6_i$ by means of first connection pads $21_i$ and to the top conductive strips $14_j$ by means of second connection pads $25_j$. The control integrated circuit can comprise electronic components such as transistors in such a way as to control the application of an electric potential difference, simultaneously or sequentially, to different pixels $P_{ij}$ of diodes.

Hybridization of the control circuit to the support can be carried out by direct bonding (or molecular adhesion bonding) of the metal-metal and dielectric-dielectric type. In a variant, it can be carried out by means of intermediate connection elements made of a meltable conductive material, such as indium balls, which come into contact with the different first and second connection pads of the optoelectronic device 1. In a variant, the control circuit can be connected to the first and second connection pads $21_i$ and $25_j$ by means of welded electrical wires (wire bonding), particularly when the connection pads are located on the front surface 3b of the support.

During operation, when a first electrical potential $V1_i$ is applied to the nucleation conductive strip $6_i$ and a second electrical potential $V2_j$ is applied to the top conductive strip $14_j$, the one or more diodes 2 located in the pixel $P_{ij}$ are activated and emit luminous radiation. The diodes 2 located in the other pixels remain deactivated. The controlled emission of each pixel $P_{ij}$, simultaneously or sequentially, is thus carried out by polarizing one or the other of the nucleation conductive strips $6_i$ and one or the other of the top conductive strips $14_j$.

Thus, the optoelectronic device 1 comprises a plurality of diodes 2 distributed in a matrix of pixels that can be activated independently of one another by means of the first and second polarization electrodes, which are in the form of conductive strips distinct from each other. Moreover, the fact that the first polarization electrodes have a supplementary nucleation surface function makes it possible to simplify both the structure and the method of implementation. Each pixel can also comprise a developed surface area of the active zone that is substantially equal to or greater than the surface area, in the plane (X, Y), of the pixel, such that the maximum luminous emission intensity of the optoelectronic device 1 can be greater than that of the optoelectronic device 1 of the prior art mentioned above. One thus obtains an optoelectronic device 1 with high luminous intensity and high resolution.

According to a preferred embodiment, the optical and/or electronic properties of the diodes 2 have improved homogeneity from one diode to the other. For this purpose, the substrate 4 comprises a top surface 4b formed by a monocrystalline material; the bottom insulating layer 5 is made of a crystalline material epitaxially grown from the top surface 4b of the substrate 4; and the nucleation conductive strips $6_i$ are made of a material comprising a transition metal epitaxially grown from the crystalline material of the bottom insulating layer 5.

Thus, as shown in FIGS. 3A and 3B, the substrate 4 comprises a monocrystalline growth material at least at the level of the top surface 4b. Thus, at the level of this top surface 4b, the growth material is composed of a single crystal and therefore does not comprise several crystals separated from one another by grain boundaries. The material of the substrate 4 has crystallographic properties, in terms of lattice parameter and structural type, suitable for the epitaxial growth of a crystalline material of the bottom insulating layer 5. Thus, it preferably has a crystalline structure of the face-centered cubic type oriented in the direction [111] or a crystalline structure of the hexagonal type oriented in the direction [0001]. Also preferably, it has a lattice parameter $a_s$ such that the lattice mismatch $m=\Delta a/a_s$ with the material of the bottom insulating layer 5 is less than or equal to 20%. Preferably, the material of the substrate 4 is monocrystalline silicon with a crystalline structure of the face-centered cubic type in which the growth plane is oriented in the direction [111] and in which the lattice parameter $a_s$ is approximately 3.84 Å.

The bottom insulating layer 5 is made of a crystalline material epitaxially grown from the top surface 4b of the substrate 4. Thus, the material of the bottom insulating layer 5 comprises a crystal lattice in epitaxial relation to that of the monocrystalline material of the substrate. The crystal lattice of the material of the bottom insulating layer 5 has a unit cell defined in particular by its crystallographic axes, designated here solely for illustrative purposes $a_i$, $b_i$, $c_i$. The crystal lattice therefore has an alignment, of at least one crystallographic axis $a_i$, $b_i$ oriented in the plane of the material and of at least one crystallographic axis $C_i$ oriented orthogonal to the plane of the material, with the crystallographic axes $a_s$, $b_s$ and $c_s$ of the monocrystalline material of the substrate respectively. This is reflected by the fact that the crystallographic axis $a_i$ is substantially parallel, at every point of the top surface 5b, to the crystallographic axis $a_s$, as are, respectively, the crystallographic axes $b_i$ and $c_i$ relative to the crystallographic axes $b_s$ and $c_s$. Moreover, whether the material of the bottom insulating layer 5 is monocrystalline or polycrystalline, because of its epitaxial relation with the monocrystalline material of the substrate, each crystallographic axis $a_i$, $b_i$, $c_i$ is substantially identical at every point of the top surface 5b. In other words, the crystallographic axes $a_i$ are substantially identical, i.e. parallel to each other, at every point of the top surface 5b, as are, respectively, the crystallographic axes $b_i$ and $c_i$. A polycrystalline material is composed, in contrast to a monocrystalline material, of several crystals separated from one another by grain boundaries.

The material of the bottom insulating layer 5 has crystallographic properties, in terms of lattice parameter and type of crystalline structure, such that it is suitable for being epitaxially grown from the monocrystalline material of the substrate 4. Moreover, it is suitable for allowing the epitaxial growth of the nucleation conductive strips $6_i$ made of a material comprising a transition metal from the top surface 5b. It preferably has a lattice parameter such that the lattice mismatch with the monocrystalline material of the substrate 4 is less than or equal to 20%. Moreover, the type of the crystalline structure is such that its crystallographic axes $a_i$, $b_i$, $c_i$ can be respectively parallel to the axes $a_s$, $b_s$ $c_s$ of the monocrystalline material of the substrate. The crystalline structure can be of the face-centered cubic type, oriented in the direction [111], or of the hexagonal type oriented in the direction [0001], or even of the orthorhombic type oriented in the direction [111]. Preferably, the material of the bottom insulating layer 5 is aluminum nitride AlN, with a lattice parameter of approximately 3.11 Å and a crystalline structure of the hexagonal type with the growth plane oriented in the direction [0001].

The nucleation conductive strips $6_i$ are made of a material comprising a transition metal epitaxially grown from the top surface 5b of the bottom insulating layer 5. The nucleation material comprises a crystal lattice that is in epitaxial relation with that of the material of the bottom insulating layer 5. The crystal lattice of the nucleation material has a unit cell defined in particular by its crystallographic axes, designated here solely by way of example $a_n$, $b_n$, $c_n$. The crystal lattice therefore has an alignment, of at least one crystallographic axis $a_n$, $b_n$ oriented in the plane of the material and of at least one crystallographic axis $c_n$ oriented orthogonal to the plane of the material, with the crystallographic axes $a_i$, $b_i$, and $c_i$, of the material of the bottom insulating layer 5, respectively, at the level of the top surface 5b. This is reflected by the fact that the crystallographic axis $a_n$ is substantially parallel, at every point of the nucleation surface 6b, to the crystallographic axis $a_i$ of the top surface 5b, as are the crystallographic axes $b_n$ and $c_n$ relative to the crystallographic axes $b_i$ and $c_i$. Moreover, whether the nucleation material is monocrystalline or polycrystalline, each crystallographic axis $a_n$, $b_n$, $c_n$ is identical at every point of the nucleation surface 6b. In other words, the crystallographic axes $a_n$ are identical, i.e. parallel to each other, at every point of the nucleation surface 6b, as are the crystallographic axes $b_n$ and $c_n$ respectively.

The nucleation material has crystallographic properties, in terms of lattice parameter and structural type, such that it can be epitaxially grown from the material of the bottom insulating layer 5. It is also suitable for the epitaxial growth from the nucleation surface 6b of a wire 9. Preferably, it thus has a lattice parameter such that the lattice mismatch with the material of the bottom insulating layer 5 is less than or equal to 20%. Moreover, the type of the crystalline structure is such that its crystallographic axes $a_n$, $b_n$, $c_n$ can be respectively parallel to the axes $a_i$, $b_i$, $c_i$ of the material of the bottom insulating layer 5. The crystalline structure can be of the face-centered cubic type, oriented in the direction [111], or of the hexagonal type, oriented in the direction [0001], or even of the orthorhombic type, oriented in the direction [111]. The nucleation material comprises a transition metal, i.e. it can be composed of a transition metal or a component comprising a transition metal, for example a nitride or a carbide of a transition metal. The transition metals, as well as their nitrides and carbides, have in particular the advantage of favorable electrical conductivity, close to that of the metals. The nucleation material can be selected from titanium Ti, zirconium Zr, hafnium Hf, vanadium V, niobium Nb, tantalum Ta, chromium Cr, molybdenum Mo, and tungsten W, a nitride of these elements TiN, ZrN, HfN, VN, NbN, TaN, CrN, MoN, or WN, or a carbide of these elements TiC, ZrC, HfC, VC, NbC, TaC, CrC, MoC, WC. The nitrides and carbides of transition metals can comprise an atomic proportion of transition metal other than 50%. Preferably, the nucleation material is selected from a nitride of titanium TiN, zirconium ZrN, hafnium HfN, vanadium VN, niobium NbN, tantalum TaN, chromium CrN, molybdenum MoN, or tungsten WN, or a carbide of titanium TiN, zirconium ZrN, hafnium HfN, vanadium VN, niobium NbN, or tantalum TaN. Preferably, the nucleation material is selected from a nitride or a carbide of titanium TiN, TiC, zirconium ZrN, ZrC, hafnium HfN, HfC, vanadium VN, VC, niobium NbN, NbC, or tantalum TaN, TaC. Preferably, the nucleation material is selected from a nitride of titanium TiN, zirconium ZrN, hafnium HfN, niobium NbN, or tantalum TaN. Preferably, the nucleation material is selected from a nitride of hafnium HfN or niobium NbN.

The first doped regions 9 of the diodes 2 are epitaxially grown from the nucleation surfaces 6b of the different nucleation conductive strips $6_i$. The material of the wire comprises a crystal lattice that is in epitaxial relation with that of the nucleation material. The crystal lattice of the material of the wire has a unit cell defined in particular by its crystallographic axes, designated here solely by way of example $a_f$, $b_f$, $c_f$. The crystallographic axes $a_f$, $b_f$, $c_f$ of the material of the wire are respectively substantially parallel to the crystallographic axes $a_n$, $b_n$, $c_n$ of the nucleation material at the level of the nucleation surface 6b. In other words, the crystallographic axis $a_f$ is parallel to the crystallographic axis $a_n$ of the nucleation surface 6b. The same applies for the crystallographic axes $b_f$ and $c_f$ relative to the crystallographic axes $b_n$ and $c_n$. Moreover, provided that the crystallographic axes $a_n$, $b_n$, $c_n$ are respectively identical from one nucleation surface 6b, to the other, each crystallographic axis $a_f$, $b_f$, $c_f$ is identical from one wire 9 to the other. In other words, the crystallographic axes $a_f$ are identical, i.e. parallel to each other, from one wire to the other. The same applies for the crystallographic axes $b_n$ and $c_n$. Thus, the wires have crystallographic properties, in terms of orientation and position of the crystal lattice, that are substantially identical. The optoelectronic device 1 thus has crystallographic properties that are substantially homogenous at the level of the wires, which contributes toward making the electrical and/or optical properties of the electroluminescent diodes 2 homogeneous.

The inventors thus found that, surprisingly, the nucleation regions composed of transition metal nitride are epitaxially grown and not merely textured when they are deposited on a bottom insulating layer 5 that is grown epitaxially and not directly from the top surface 4b of the monocrystalline material of the substrate.

The term epitaxy is understood as meaning that the crystalline epitaxial material comprises a crystal lattice or crystalline structure that is in epitaxial relation with that of the nucleation material from which it is epitaxially grown. The term epitaxial relation is understood to mean that the epitaxial material has an alignment of the crystallographic orientations of its crystal lattice, in at least one direction in the plane of the material and at least one direction orthogonal to the plane of the material, with those of the crystal lattice of the nucleation material. Here, the plane of the epitaxial material is a growth plane of the material parallel to the nucleation surface. The alignment is preferably carried out to within 30°, or even within 10°. This is reflected by the fact that there is a total match of orientation and crystallographic position between the crystal lattice of the epitaxial material and that of the nucleation material. Preferably, the crystalline epitaxial material has a lattice parameter $a_2$, measured in the growth plane, such that the lattice mismatch $m=(a_2-a_1)/a_1=\Delta a/a_1$ with the nucleation material of lattice parameter $a_1$ is less than or equal to 20%. Thus, when a crystalline material is epitaxially grown from a crystalline nucleation material, i.e. formed by epitaxial growth, the epitaxial relation between these two crystalline materials is reflected by the fact that at least one crystallographic axis of the crystal lattice of the epitaxial material, oriented in the plane of the epitaxial material, for example $a_e$ and/or $b_e$, and at least one crystallographic axis, oriented orthogonal to the plane, for example $c_e$, are respectively substantially parallel to the crystallographic axes $a_n$ and/or $b_n$ and $c_n$ of the crystal lattice of the nucleation material.

An epitaxial material is a particular case of so-called textured materials, in the sense that textured materials have a preferential crystallographic direction oriented orthogonal to the plane of the material, but do not have a preferential crystallographic direction oriented in the plane of the material. In addition, the preferential crystallographic direction orthogonal to the plane of the textured material is not or is only minimally dependent on the crystalline properties of the nucleation material. Thus, a textured material has a single preferred crystallographic direction, for example that of the c axis, and not three preferred directions. The network of the textured material thus has a polycrystalline structure of which the different crystalline domains, separated by grain boundaries, are all oriented along the same preferred crystallographic c axis. In contrast, they do not have relations of parallelism among them in the growth plane. In other words, the c axes of the crystalline domains are parallel to each other, but the a axes, like the b axes, are not parallel to each other and are oriented in a substantially random manner. This preferred crystallographic direction is not or is only minimally dependent on the crystalline properties of the nucleation material. Thus, it is possible to obtain a textured material from a nucleation material having a monocrystalline, polycrystalline, or even amorphous structure.

Thus, as shown in FIG. 3C, the wires 9, here made of GaN epitaxially grown by MOCVD, when they are epitaxially grown from a nucleation material that is textured and not epitaxially grown, all have the same growth direction, the latter being substantially parallel to the crystallographic axis $c_n$. In contrast, it can be seen that the hexagonal shape of the wires 9 is not oriented in an identical manner from one wire to the other, which reflects the fact that the crystallographic axes $a_f$ and $b_f$ are not respectively oriented in an identical manner from one wire to the other. The wires 9 then have crystallographic properties that differ from one wire to the other, which can be reflected in a certain degree of heterogeneity in the electrical and/or optical properties of the electroluminescent diodes 2.

In contrast, as shown in FIG. 3D, the wires 9, here made of GaN epitaxially grown by MOCVD, when they are epitaxially grown from a nucleation epitaxial material and not textured, all have the same growth direction, the latter being substantially parallel to the crystallographic axis $c_n$. Moreover, it can be seen that the hexagonal shape of the wires 9 is oriented here in an identical manner for all of the wires 9, which reflects the fact that the crystallographic axes $a_f$ and $b_f$ are respectively oriented in an identical manner from one wire to the other. Thus, the wires 9 have crystallographic properties, in terms of orientation and crystal lattice position, that are substantially identical. The optoelectronic device 1 thus has crystallographic properties that are substantially homogeneous at the level of the wires 9, which contributes toward making the electrical and/or optical properties of the electroluminescent diodes 2 homogeneous.

FIGS. 4A to 4I show a schematic and partial cross-sectional view of various steps of an example of a production method of the optoelectronic device 1 according to the preferred embodiment described above. Each figure shows a sectional view along plane AA (left) and a sectional view along plane BB (right).

Figure 4A:
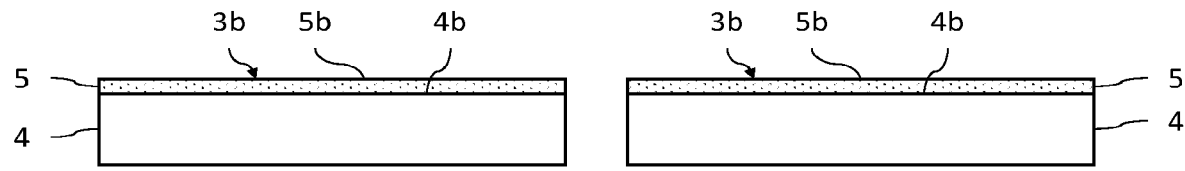
FIGS. 4A to 4I show sectional views along plane AA and plane BB of different steps of a method of implementing an optoelectronic device according to another embodiment.

Referring to FIG. 4A, the substrate 4 composed of a monocrystalline material is provided at least at the level of the top surface. In this example, the substrate 4 is made of silicon having a structure of the face-centered cubic type oriented in the direction [111]. Its lattice parameter in the plane of the top surface is of the order of 3.84 Å.

After this, one disposes the bottom insulating layer 5 in such a way as to cover the top surface of the substrate by means of a method of the chemical vapor deposition (CVD) type, for example with organometallic precursors (MOCVD, metal-organic chemical vapor deposition) or by a method of the molecular beam epitaxy (MBE) type, the hybrid vapor phase epitaxy (HVPE) type, the atomic layer epitaxy (ALE) type or atomic layer deposition (ALD) type, or even by evaporation or sputtering.

In this example, the material of the bottom insulating layer 5 is epitaxially grown aluminum nitride, the crystalline structure of which is of the hexagonal type and is oriented in the direction [0001]. Its lattice parameter in the plane (X, Y) is of the order of 3.11 Å. It is deposited by MOCVD. The nominal V/III ratio, defined as the ratio of the molar flux of group V elements to the molar flux of group III elements, i.e. here the N/Al ratio, is between 200 and 1000. The pressure is of the order of 75 torr. The growth temperature T, measured at the level of the substrate, can in a first stage be greater than or equal to 750° C. for the nucleation phase, and in a second stage be of the order of 950° C. for the growth phase.

Figure 4B:
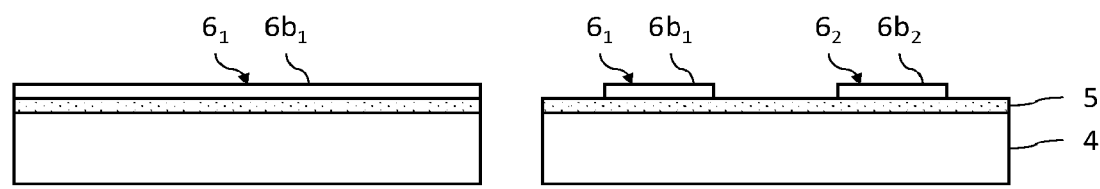

Referring to FIG. 4B, one forms the nucleation conductive strips $6_i$ on the top surface of the bottom insulating layer 5. For this purpose, one carries out epitaxial growth of a layer of a nucleation material comprising a transition metal, for example by means of a sputtering technique, in which the growth temperature is advantageously between room temperature, for example 20° C., and 1000° C. Surprisingly, the nucleation strips are also epitaxially grown when they are deposited by sputtering at a growth temperature between room temperature, for example 20° C., and 500° C., for example a temperature substantially equal to 400° C. The power can be of the order of 400 W. The pressure can be of the order of $8.10^{-3}$ torr. The techniques of high-temperature sputtering and chemical vapor deposition can also be used. After this, by means of classical photolithography and etching techniques, the continuous layer of the nucleation material is etched to form a plurality of nucleation conductive strips $6_i$ that are distinct from one another.

Advantageously, in cases where the nucleation conductive strips $6_i$ are made of a polycrystalline material, a crystallization annealing step can be carried out in such a way as to obtain a monocrystalline nucleation material. The annealing can be carried out at an annealing temperature substantially corresponding to the crystallization temperature of the nucleation material, namely 1620° C. in the present case of a transition metal nitride. Surprisingly, however, crystallization of the nucleation material can also be obtained at an annealing temperature less than the crystallization temperature, for example in a temperature range of 600° C. to 1620° C., and preferably between 800° C. to 1200° C., for example equal to approximately 1000° C. The annealing can be carried out for a period for example of greater than 1 min, preferably greater than 5 min, or even than 10 min, for example 20 min. It can be carried out under a flow of nitrogen ($N_2$) and ammonia ($NH_3$). The pressure can be of the order of 75 torr.

Figure 4C:
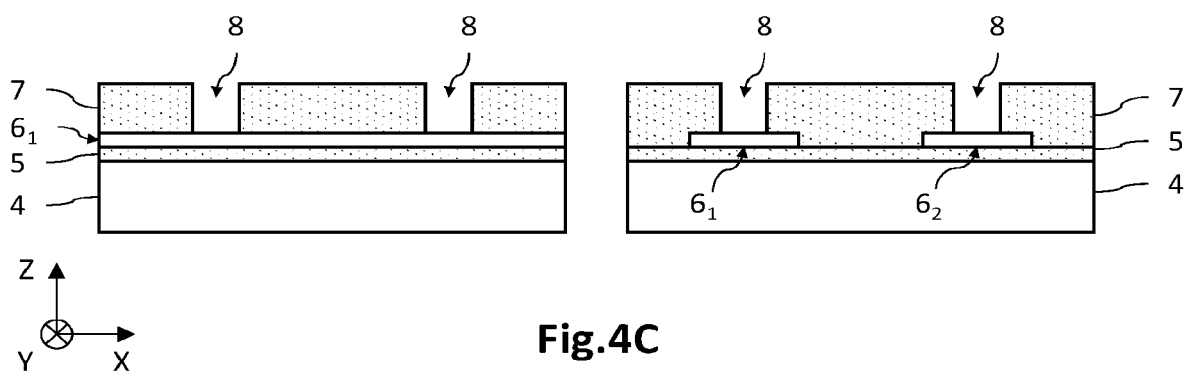

Referring to FIG. 4C, one then deposits the intermediate insulating layer 7, forming a growth mask, and produces the through-openings 8. A layer of a dielectric material is thus deposited in such a way as to cover the nucleation conductive strips $6_i$ and the bottom insulating layer 5, and through-openings 8 are then formed in such a way as to open locally onto the nucleation surfaces. The dielectric material is e.g. an oxide of silicon (such as $SiO_2$) or a nitride of silicon (such as $Si_3N_4$), or even a stack of several different dielectric materials. It is etched in a selective manner with respect to the material of the nucleation conductive strips $6_i$. Preferably, the lateral dimensions of the openings are less than the width of the nucleation conductive strips $6_i$, for example at least two times less.

Figure 4D:
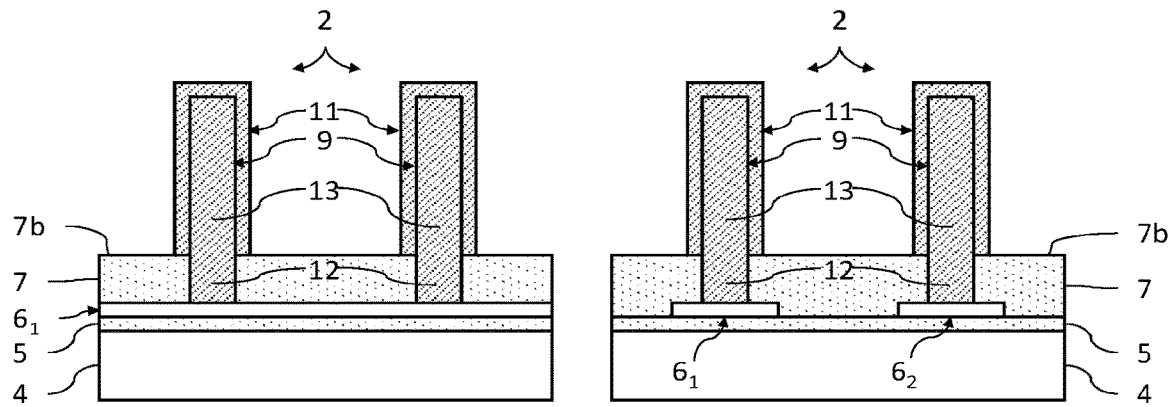

Referring to FIG. 4D, the wires 9, here made of GaN, are formed by epitaxial growth from the nucleation surfaces of the different nucleation conductive strips $6_i$, through the openings of the intermediate insulating layer 7, for example according to a method identical or similar to that described in the document WO2012/136665. The growth temperature is increased to a first value $T_1$, for example between 950° C. and 1100° C., and particularly between 990° C. and 1060° C. The nominal V/III ratio, here the N/Ga ratio, has a first value $(V/III)_1$ of approximately 10 to 100, for example substantially equal to 30. The group III and group V elements are derived from precursors injected into the epitaxy reactor, for example trimethylgallium (TMGa) or triethylgallium (TEGa) for gallium, and ammonia ($NH_3$) for nitrogen. The $H_2/N_2$ ratio has a first value $(H_2/N_2)_1$ greater than or equal to 60/40, and preferably greater than or equal to 70/30, or even more, for example substantially equal to 90/10. The pressure can be fixed at approximately 100 mbar. One thus obtains first doped regions 9 in the form of wires that extend along the longitudinal axis Δ from the nucleation surfaces. The first semiconductor compound of the first doped regions 9, namely GaN in this case, is n-doped with silicon. The bottom portion 12 of the wires 9 is located in the openings of the intermediate insulating layer 7, and is prolonged along the longitudinal axis Δ by the top portion 13. One obtains here a plurality of wires 9 epitaxially grown from the nucleation surfaces, the crystallographic properties of which are substantially identical, provided that nucleation of the wires 9 has been carried out from nucleation surfaces that have substantially the same crystallographic properties.

The active zones are formed by epitaxial growth from the exposed surface of the wires 9, i.e. here on the top portion 13 of the wires 9. More specifically, one forms a stack of barrier layers and at least one layer that forms a quantum well, said layers being alternated in the direction of the epitaxial growth. The layers that form the quantum wells and the barrier layers can be made of InGaN, with different atomic proportions for the layers of quantum wells and the barrier layers. By way of example, the barrier layers are made of $In_xGa_{(1-x)}N$, where x is approximately equal to an atomic proportion of 18%, and the layers of quantum wells are also made of $In_yGa_{(1-y)}N$, where y is greater than x, for example of the order of an atomic proportion of 25%, in such a way as to improve the quantum confinement of the charge carriers in the quantum wells. The formation of the barrier layers and the layers of quantum wells can be carried out at a growth temperature value $T_3$ substantially equal to the value $T_2$, namely here 750° C. The V/III ratio has a value $(V/III)_3$ substantially equal to the value $(V/III)_2$. The $H_2/N_2$ ratio has a value substantially equal to the value $(H_2/N_2)_2$ during the formation of the barrier layers and has a value substantially less than the value $(Hz/N_2)_2$ during the formation of the layers of quantum wells, for example 1/99. The pressure can remain unchanged. One thus obtains barrier layers of InGaN with an atomic proportion of approximately 18% indium and layers of quantum wells of InGaN with an atomic proportion of approximately 25% indium.

The second p-doped regions are then formed by epitaxial growth in such a way as to cover and at least partly surround the active zones. For this purpose, the growth temperature can be raised to a fourth value $T_4$ greater than the value $T_3$, for example of the order of 885° C. The V/III ratio can be increased to a fourth value $(V/III)_4$ greater than the value $(V/III)_3$, for example of the order of 4000. The $H_2/N_2$ ratio is increased to a fourth value $(H_2/N_2)_4$ greater than the value $(H_2/N_2)_2$, for example of the order of 15/85. Finally, the pressure can be reduced to a value of the order of 300 mbar. One thus obtains second p-doped regions 11, composed for example of GaN or InGaN of the p-doped type, that cover and here continuously surround the active zones. The second p-doped regions 11 and the active zones thus form the shells of the diodes 2 in a core/shell configuration. In this example, the active zone and the second doped region 11 of the diodes 2 cover the top portion 13 of each wire from the top surface of the intermediate insulating layer 7.

Figure 4E:
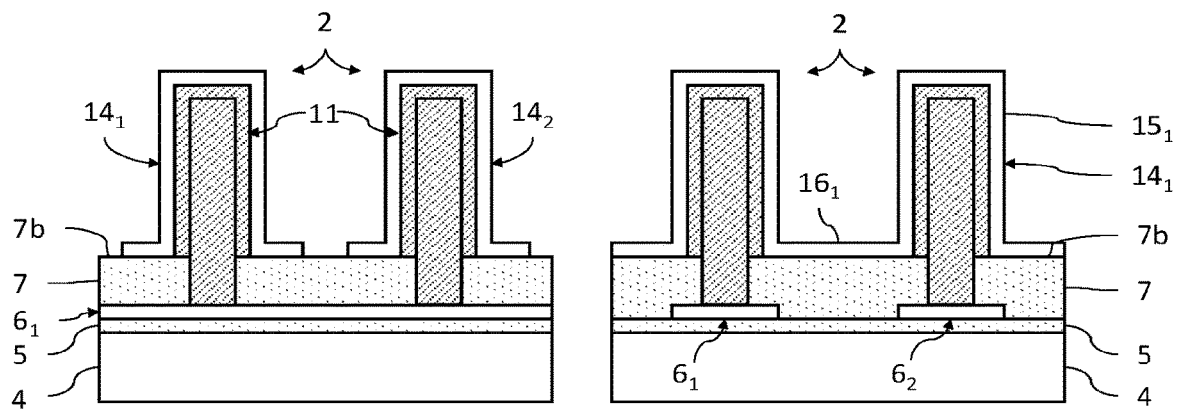

Referring to FIG. 4E, the top conductive strips $14_j$ are formed distinct from each other, extending on the top surface of the intermediate insulating layer 7 and coming into contact with the second doped regions 11 of the diodes. For this purpose, a continuous layer of a conductive material, here partially transparent to the luminous radiation emitted by the diodes, is conformally disposed. After this, by means of photolithography and etching, the top conductive strips $14_j$ are formed so as to be distinct from each other. Here, each strip comprises portions that cover the second doped regions 11 of a set $D_j$ of diodes, these covering portions $15_j$ being connected two by two by connecting parts $16_j$ that extend on the top surface of the intermediate insulating layer 7.

Figure 4F:
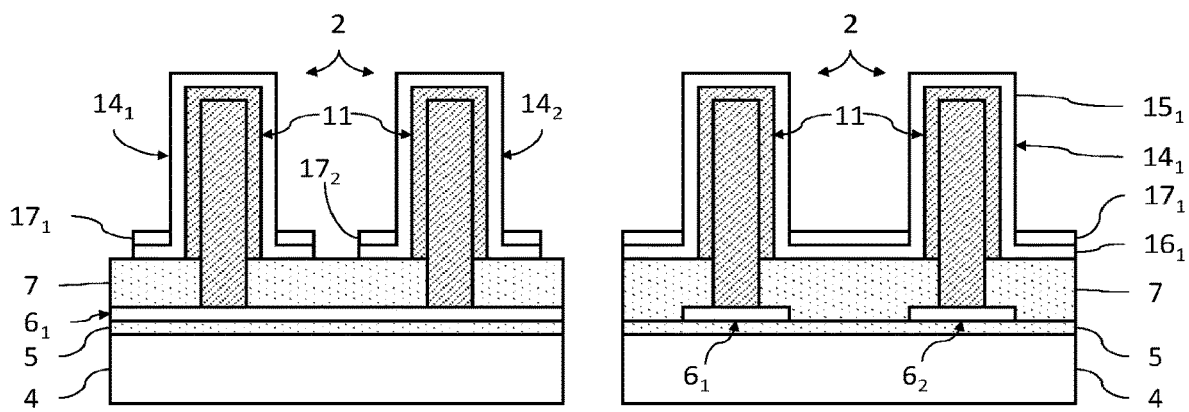

Referring to FIG. 4F, advantageously, the connecting parts $16_j$ of the top conductive strips $14_j$ are covered by a metal layer 17 suitable for reducing the electrical resistance of the top conductive strips $14_j$ and thus improving circulation of the electric current. This metal layer 17 is deposited on the top conductive strips $14_j$ and is then etched so as to cover only the connecting parts $16_j$ and not the covering portions $15_j$. This metal layer 17 can be composed of one or more materials selected from aluminum, silver, gold, or any other suitable material, and has a thickness for example of between 5 nm and 200 nm, and preferably between 10 nm and 100 nm, for example equal to approximately 30 nm. In a variant, the metal layer 17 can be deposited prior to deposition of the top conductive strips $14_j$. It is etched in such a way as not to extend around the second doped regions 11 along the Z axis.

Figure 4G:
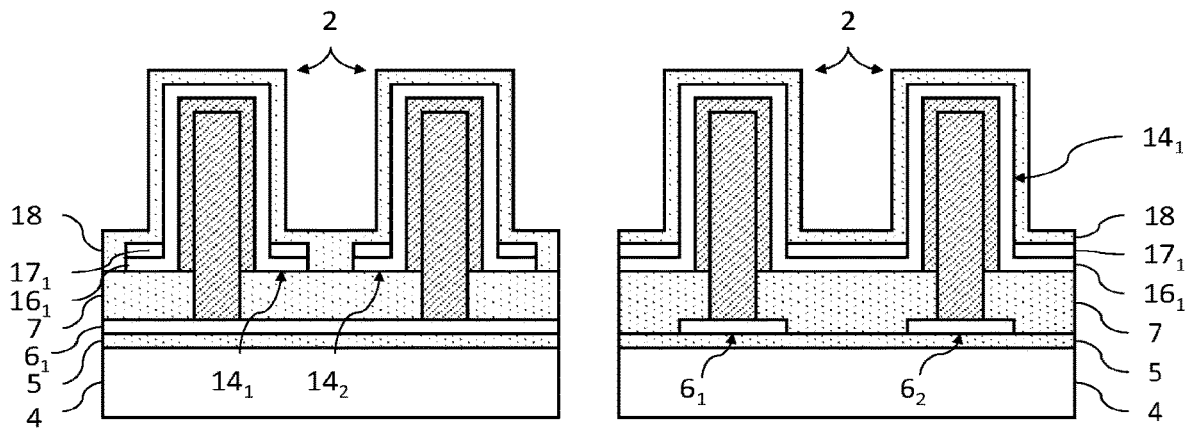

Referring to FIG. 4G, advantageously, one disposes the top insulating layer 18 in such a way as to continuously cover the top conductive strips $14_j$, the metal layer 17 and the intermediate insulating layer 7. The top insulating layer 18 is made of a dielectric material such as e.g. an oxide of silicon (such as $SiO_2$) or a nitride of silicon (such as $Si_3N_4$), or even a stack of several different dielectric materials.

Figure 4H:
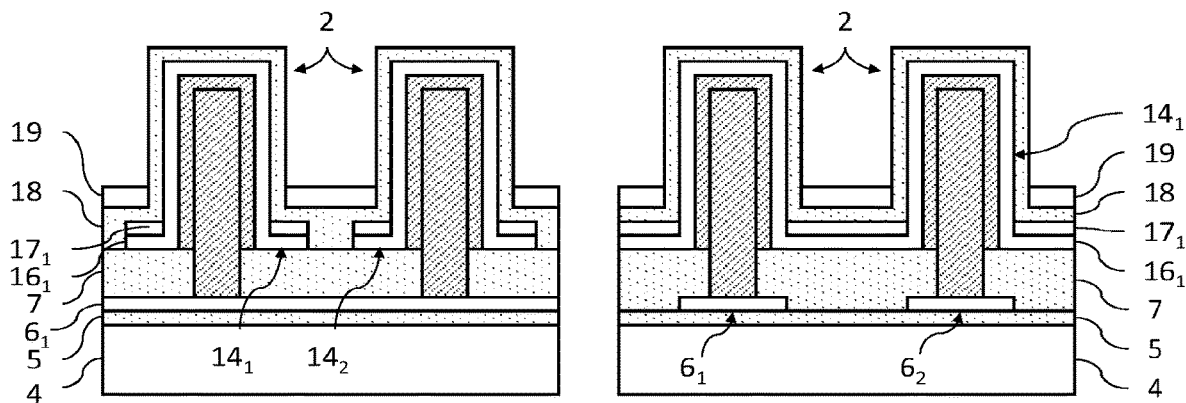

Referring to FIG. 4H, advantageously, one then disposes a reflecting layer 19 in such a way as to cover the surface of the top insulating layer 18 without covering the wires 9. The reflecting layer 19 thus extends essentially in the plane (X, Y). This reflecting layer 19 can be composed of one or more materials selected from aluminum, silver, gold, or any other suitable material and has a thickness for example of between 20 nm and 1500 nm, preferably between 400 nm and 800 nm. The thickness of the reflecting layer 19 is selected such that the incident luminous radiation emitted by the diodes 2 is reflected in the direction +Z.

Figure 4I:
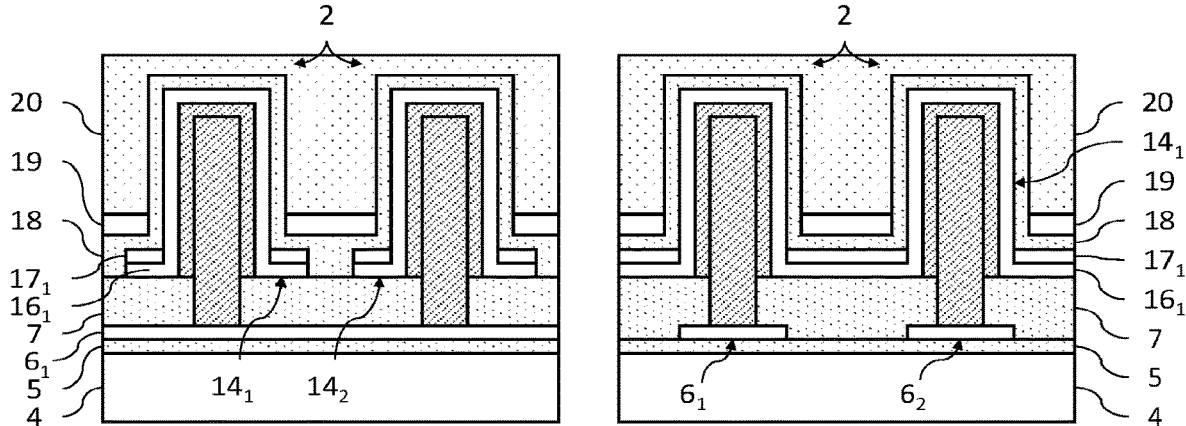

Referring to FIG. 4I, one disposes an encapsulation layer 20 in such a way as to entirely cover the diodes. The encapsulation layer 20 is made of a dielectric material transparent to the luminous radiation emitted by the diodes 2, such as e.g. an oxide of silicon (such as $SiO_2$) or a nitride of silicon (such as $Si_3N_4$), or even a stack of several different dielectric materials. The thickness of the encapsulation layer 20 is for example between 250 nm and 50 μm.

The first $21_i$ and second $25_j$ connection pads are then produced. In cases where these pads are made on the rear surface 3a of the support, the substrate 4 is thinned, and the first through openings $22_i$, which open onto the nucleation conductive strips $6_i$, and the second through openings $26_j$, which open onto the top conductive strips $14_j$, are then made. The sides of the through openings can be coated with an insulating layer 24, then a conductive material 23 fills the interior of the through openings. The first and second connection pads $21_i$ and $25_j$ are then formed respectively at the level of each first and second through opening $22_i$ and $26_j$. Hybridization of the support to a control integrated circuit is then carried out by molecular bonding, wire cabling, or connection by means of conductive and meltable elements.

The production method of the optoelectronic device 1 has the advantage of not requiring individual electrical separation of the diodes 2 by means of insulating trenches formed between the diodes 2 from the front surface 3b of the support. The diodes 2 are here individually separated by the first and second electrodes that are in the form of conductive strips distinct from each other. Thus, the support has improved mechanical strength, which in particular facilitates hybridization to the control circuit. Moreover, the diodes 2 have retained optical and/or electronic properties, provided that individual separation of the diodes 2 does not require, as in the example of the prior art mentioned above, etching of the doped regions and the active zone. The homogeneity of the optical and/or electronic properties of the diodes 2 is also improved when the diodes 2 are formed from nucleation conductive strips 6$_i$ in epitaxial relation with the monocrystalline material of the substrate.

Particular embodiments have just been described. Different variants and modifications will be obvious to the person skilled in the art.

Figure 5:
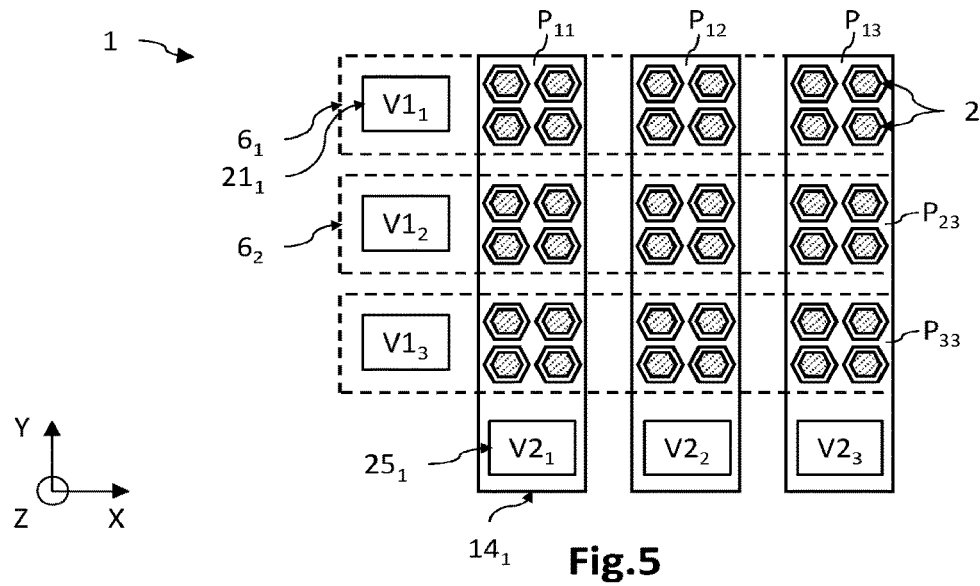
FIG. 5 is a schematic and partial top view of an optoelectronic device according to an embodiment wherein each pixel comprises several diodes.

Thus, as shown in FIG. 5, each pixel P$_{ij}$ can comprise several diodes. Thus, application of a potential difference to the pixel P$_{ij}$ results in activation of the diodes 2 of this pixel, the diodes 2 of the other pixels remaining deactivated.

Figure 6A:
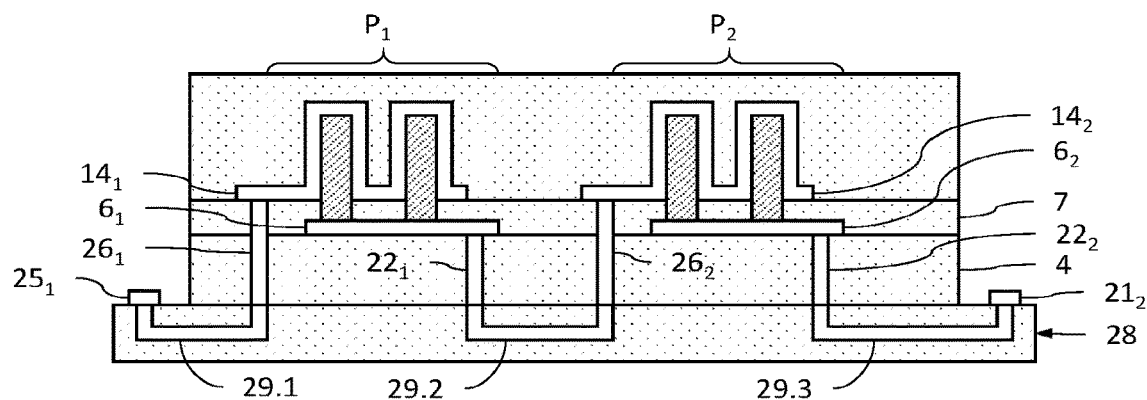
FIGS. 6A and 6B are cross-sectional schematic and partial views of an optoelectronic device comprising a routed integrated circuit having electrical series interconnections of pixels (FIG. 6A) and of an optoelectronic device comprising internal electrical interconnections with serialized pixels (FIG. 6B).

In addition, as shown in FIG. 6A, the optoelectronic device 1 can comprise a routing integrated circuit 28 with electrical interconnections 29 providing connection in series of several pixels among one another. In this example, the diodes 2 of the pixel P$_1$ are connected in series with the diodes 2 of the pixel P$_2$ by means of the electrical interconnections 29 of the routing circuit 28 connected to the first and second through openings 22$_i$, 26$_j$. The routing integrated circuit 28 can be assembled and electrically connected to the control circuit (not shown) by means of the connection pads 21$_i$, 25$_j$. Thus, in this example, a potential difference can be applied to the pixels P$_1$ and P$_2$ connected in series by means of connection pads 21$_2$ and 25$_1$. The electrical potential of the connection pad 25$_1$ is applied to the top conductive strip 14$_1$ of the pixel P$_1$ by means of the through opening 26$_1$ and the interconnexion 29.1, and the electrical potential of the connection pad 21$_2$ is applied to the nucleation conductive strip 6$_2$ of the pixel P$_2$ by means of the through opening 22$_2$ and the interconnexion 29.3. The pixels P$_1$ and P$_2$ are connected in series by the electrical connection of the nucleation conductive strip 6$_1$ of the pixel P$_1$ with the top conductive strip 14$_2$ of the pixel P$_2$ carried out by means of the through openings 22$_1$ and 26$_2$ and the interconnexion 29.2. In a variant, the interconnexion 29.2 can be omitted and the through openings 22$_1$ and 26$_2$ can be in direct electrical contact in the substrate 4.

Figure 6B:
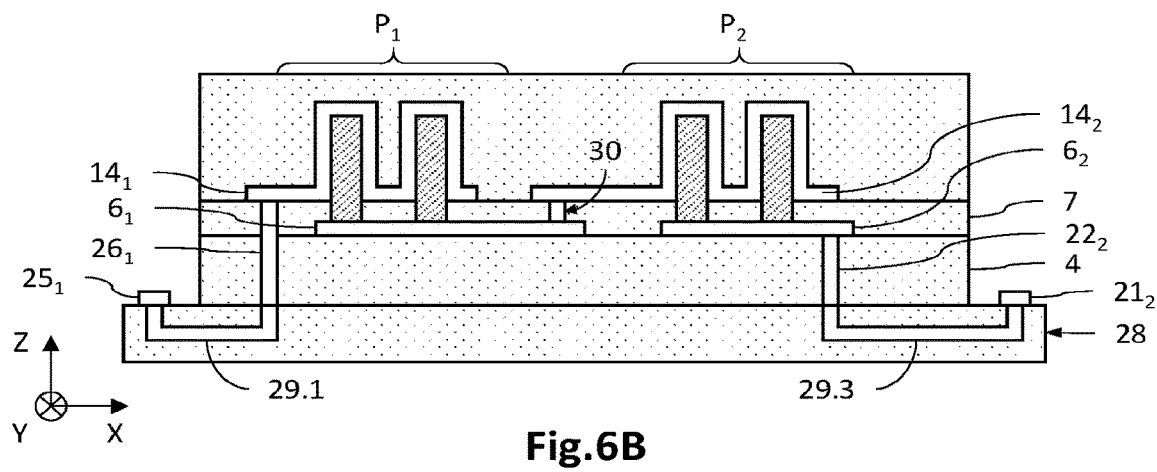

As shown in FIG. 6B, the optoelectronic device 1 can comprise one or several electrical interconnections 30 located at the level of the intermediate insulating layer 7, which allows, in this example, the serial connection of the diodes 2 of the pixel P$_1$ with the diodes 2 of the pixel P$_2$. The electrical interconnection 30 is formed here by a through opening filled with a conductive material opening on the one hand onto the nucleation conductive strip 6$_1$ of the pixel P$_1$ and on the other onto the top conductive strip 142 of the pixel P$_2$. In this example, a routing circuit 28 is provided which provides electrical polarization of the pixels P$_1$ and P$_2$ connected in series by means of the interconnexions 29.1 and 29.3.

The examples of FIGS. 6A and 6B are given solely by way of example, and other configurations of electrical interconnections that are internal or formed in a routed integrated circuit are possible so as to provide a connection of the pixels either in series or in parallel. In addition, in a variant, and as mentioned above, the electrical connection pads can be located on the front surface or the rear surface of the support.

Thus, we have described an optoelectronic device 1 comprising electroluminescent diodes 2 that can advantageously form a display screen or an image projector of high luminous intensity and high spatial resolution. However, the invention also applies to the field of photodiodes suitable for receiving and detecting luminous radiation and converting it into electrical signals relative to the various pixels.

We have described three-dimensional diodes 2 of the wire type, but the invention also applies to the first doped regions in the form of three-dimensional pads of which the height along the Z axis is of the same order of magnitude as their transverse dimensions in the plane (X, Y), and to the first doped regions in the form of optionally truncated pyramids.

We have described diodes 2 in a core/shell configuration wherein the active zones and the second doped regions cover the sides and the peak of the wires 9. The invention also applies to the axial configuration of the diodes 2 wherein the active zones and the second doped regions cover only the peak of the wires.

We have also described a relative orientation substantially orthogonal to the nucleation conductive strips with respect to the top conductive strips, but other orientations are possible wherein the nucleation strips and the top strips form for example, two by two, a non-zero angle of less than or greater than 90°.

The invention claimed is:

1. An optoelectronic device, comprising:
   a support including a rear surface and a front surface opposite each other;
   a plurality of nucleation conductive strips forming first polarization electrodes, distinct from each other and resting on the front surface, made of an electrically conductive material configured for the growth of first doped regions of diodes, wherein said electrically conductive material includes at least one of a material based on gallium nitride or a material including a transition metal;
   an intermediate insulating layer covering the nucleation conductive strips, and including through-openings onto the nucleation conductive strips;
   a plurality of diodes, each of the plurality of diodes including a first three-dimensional doped region and a second doped region disposed to form a p-n junction, the first doped regions being in contact with the nucleation conductive strips through the through-openings and extending along a longitudinal axis substantially orthogonal to the front surface;
   a plurality of top conductive strips forming second polarization electrodes, distinct from each other and resting on the intermediate insulating layer, each top conductive strip being disposed to be in contact with second doped regions of a set of diodes of which the first doped regions are in contact with different nucleation conductive strips; and
   wherein the first doped regions in contact with the nucleation conductive strips are made of a first crystalline material having a first lattice parameter, wherein said electrically conductive material of said nucleation conductive strips is made of a second crystalline material having a second lattice parameter, and wherein a lattice mismatch between said first and second lattice parameter is less than or equal to 20%.

2. The optoelectronic device as claimed in claim 1, wherein the support includes an electrically insulating substrate, a top surface of the electrically insulating substrate forming the front surface, or includes a semiconductor or electrically conductive layer or substrate coated with a bottom insulating layer, one surface of which forms the front surface.

3. The optoelectronic device as claimed in claim 1, wherein each nucleation conductive strip extends longitudinally on the front surface and is electrically separated from its neighbors, transversely, by the intermediate insulating layer.

4. The optoelectronic device as claimed in claim 1, wherein each top conductive strip extends longitudinally on the intermediate insulating layer, and is electrically separated from its neighbors, transversely, by a top insulating layer.

5. The optoelectronic device as claimed in claim 1, wherein the top conductive strips are made of an at least partially transparent conductive material and at least partially cover the second doped regions.

6. The optoelectronic device as claimed in claim 5, wherein each top conductive strip includes portions covering the second doped regions of a set of diodes, the covering portions being connected to each other by connecting parts resting on the intermediate insulating layer.

7. The optoelectronic device as claimed in claim 6, wherein the connecting parts of the top conductive strips are at least partially coated with a metal layer.

8. The optoelectronic device as claimed in claim 1, further comprising:
   at least one of first connection pads and second connection pads, the first connection pads resting on the rear surface and electrically connected to the nucleation conductive strips by first openings passing through the support and filled with a conductive material, and the second connection pads resting on the rear surface and electrically connected to the top conductive strips by second openings passing through the support and the intermediate insulating layer and filled with a conductive material.

9. The optoelectronic device as claimed in claim 1, further comprising:
   a control integrated circuit assembled to the support and electrically connected to the nucleation conductive strips and the top conductive strips, configured to apply a potential difference, sequentially, to different subsets of diodes, the one or more diodes of a same subset being in contact with a same nucleation conductive strip and a same top conductive strip, the one or more diodes of different subsets of diodes being in contact with at least one of different nucleation conductive strips and different top conductive strips.

10. The optoelectronic device as claimed in claim 1, wherein at least one diode in contact with a first nucleation conductive strip and a first top conductive strip is connected in series with at least one other diode, the latter being in contact with a second nucleation conductive strip distinct from the first nucleation strip and a second top conductive strip distinct from the first top strip.

11. The optoelectronic device as claimed in claim 1, wherein the support includes a substrate made of a monocrystalline material that forms a top surface, on which rests a bottom insulating layer made of a dielectric material epitaxially grown from the top surface of the substrate and forming an opposing top surface, the nucleation conductive strips being made of a material comprising a transition metal forming a crystalline nucleation material, epitaxially grown from the top surface of the bottom insulating layer and forming a nucleation surface on which the first doped regions of the diodes are in contact.

12. The optoelectronic device as claimed in claim 11, wherein the material of the bottom insulating layer is selected from aluminum nitride and oxides of aluminum, titanium, hafnium, magnesium and zirconium, and has a hexagonal, face-centered cubic, or orthorhombic crystalline structure.

13. The optoelectronic device as claimed in claim 11, wherein the material of the nucleation conductive strips is selected from titanium, vanadium, chromium, zirconium, niobium, molybdenum, hafnium, tantalum and tungsten, or from a nitride or a carbide of titanium, vanadium, chromium, zirconium, niobium, molybdenum, hafnium, tantalum and tungsten, and has a hexagonal or face-centered cubic crystalline structure, or is a gallium-nitride-based material.

14. The optoelectronic device as claimed in claim 11, wherein the monocrystalline material of the substrate is selected from a group III-V compound, a group II-VI compound, or a group IV element or compound and has a hexagonal or face-centered cubic crystalline structure.

15. A method for producing the optoelectronic device as claimed in claim 1, comprising:
   epitaxial growing of the nucleation conductive strips by sputtering at a growth temperature between room temperature and 500° C.

* * * * *